(12) United States Patent
Sparacino

(10) Patent No.: US 7,397,359 B2
(45) Date of Patent: Jul. 8, 2008

(54) REMOTE CONTROL FOR BATTERY ELECTRICAL SYSTEM TESTER APPARATUS AND METHOD

(75) Inventor: Steven J. Sparacino, Portage, MI (US)

(73) Assignee: SPX Corporation, Charlotte, NC (US)

( * ) Notice: Subject to any disclaimer, the term of this patent is extended or adjusted under 35 U.S.C. 154(b) by 183 days.

(21) Appl. No.: 11/168,293

(22) Filed: Jun. 29, 2005

(65) Prior Publication Data

US 2007/0013507 A1    Jan. 18, 2007

(51) Int. Cl.
*G08B 26/00* (2006.01)
*G08B 21/00* (2006.01)
*G01R 31/08* (2006.01)

(52) U.S. Cl. .................... 340/505; 340/514; 340/636.1; 324/522

(58) Field of Classification Search ................ 340/505, 340/514, 636.1, 636.11, 636.12, 636.13, 340/636.19; 324/522, 523
See application file for complete search history.

(56) References Cited

U.S. PATENT DOCUMENTS

| 5,935,180 | A | * | 8/1999 | Fieramosca et al. | ........... 701/29 |
| 6,415,209 | B1 | * | 7/2002 | Reimer | ........... 701/21 |
| 6,871,151 | B2 | * | 3/2005 | Bertness | ........... 702/63 |
| 7,012,433 | B2 | * | 3/2006 | Smith et al. | ........... 324/426 |
| 7,184,899 | B2 | * | 2/2007 | Cruz | ........... 702/57 |
| 2006/0119365 | A1 | * | 6/2006 | Makhija | ........... 324/380 |

* cited by examiner

*Primary Examiner*—Toan N. Pham
(74) *Attorney, Agent, or Firm*—Baker & Hostetler LLP

(57) ABSTRACT

A vehicle battery electrical system tester with a hand-held remote control can include a vehicle battery electrical system tester with a radio frequency transceiver and a remote control unit with a radio frequency transceiver. Preferably, the vehicle battery electrical system tester and the remote control unit both include a radio frequency integrated circuit transceiver microchip. In addition, each can include a microcontroller coupled to the transceiver to control the transceiver. Furthermore, each can include an antenna, preferably an integrated circuit antenna. The remote control unit can include a visual display device, such as an LCD display, and an input device, such as a keypad.

17 Claims, 4 Drawing Sheets

REMOTE CONTROL FOR BATTERY ELECTRICAL SYSTEM TESTER APPARATUS AND METHOD

FIELD OF THE INVENTION

The present invention relates generally to vehicle electrical system diagnostics. More particularly, the present invention relates to hand-held vehicle battery electrical system testers with remote control.

BACKGROUND OF THE INVENTION

Vehicles with internal combustion engines typically include a battery to provide electrical power for starting the engine with an electrical starter motor. When the engine is running, a generator or alternator provides current to recharge the battery for future use. The battery system on a particular vehicle may include a single battery or a pack, that is, multiple batteries connected to each other. In most cases, the battery electrical system on a vehicle operates at an electrical potential difference of 6, 12 or 24 volts.

A variety of vehicle battery electrical system testers have been developed to verify the status of the battery, starting system, charging system and electrical system (collectively, "battery electrical system") on various vehicles. Typically a battery electrical system tester is connected to the positive and negative terminals of a vehicle battery, or to the vehicle electrical and charging system, in order to measure electrical potential and current in the battery electrical system, to diagnose electrical problems with the battery electrical system.

After connecting to the battery electrical system, an operator then performs a sequence of test operations. For example, the operator may initially turn the vehicle electrical system power on, by turning a key or other switch to the "on" position, and then start the vehicle, all the while monitoring the battery electrical system to verify the proper operation of said system.

On some vehicles, particularly large or heavy equipment, the distance between the operator station or control panel of the vehicle from the vehicle battery electrical system connections can be substantial. For example, on heavy equipment, the distance from the battery to the operator station may be forty feet or more. Thus, typically the operator must connect the tester to the battery terminals using test leads or cables that are long enough to reach the operator station of the vehicle; however, long cables can become entangled in the equipment and pose difficulties or danger to the operator. Otherwise, the operator must move back and forth between the location of the battery and the operator station or control panel, which can be time consuming, and in many cases, poses a danger to the operator.

Accordingly, it is desirable to provide a method and apparatus that allows the test operator to monitor and control the tester from a remote location, such as the operator station of the vehicle, without the use of long test leads to connect to the battery electrical system.

SUMMARY OF THE INVENTION

The foregoing needs are met, to a great extent, by the present invention, wherein in one aspect an apparatus is provided that in some embodiments allows a test operator to monitor and control a vehicle battery electrical system tester from a remote location without the use of long test leads or cables.

In accordance with one aspect of the present invention, a battery electrical system tester with remote control can include a battery electrical system tester that includes a tester radio frequency transceiver, as well as a remote unit that also includes a remote radio frequency transceiver. In operation, the battery electrical system tester can send data to the remote unit by way of the tester transceiver, and the remote unit can receive the sent data by way of the remote transceiver.

In accordance with another aspect of the present invention, a battery electrical system tester with remote control can include means for sensing a battery electrical system electrical signal, first means for generating radio frequency electromagnetic waves coupled to the means for sensing an electrical signal, and first means for sensing radio frequency electromagnetic waves coupled to the means for sensing an electrical signal. In addition, the tester can include remote means for controlling the means for sensing, second means for generating radio frequency electromagnetic waves coupled to the remote means for controlling, and second means for sensing radio frequency electromagnetic waves coupled to the remote means for controlling. In operation, the means for sensing an electrical signal can send data to the remote means for controlling by way of the first means for generating, and the remote means for controlling can receive the sent data by way of the second means for sensing.

In accordance with yet another aspect of the present invention, a method of remotely controlling a battery electrical system tester can include sensing a battery electrical system electrical signal, generating a first sequence of radio frequency electromagnetic waves to broadcast data based on the electrical signal, and remotely sensing the first sequence of radio frequency electromagnetic waves. In addition, the method can include remotely generating a first control signal, remotely generating a second sequence of radio frequency electromagnetic waves based on the first control signal, and sensing the second sequence of radio frequency electromagnetic waves. Furthermore the method can include generating a second control signal based on the second sequence of radio frequency electromagnetic waves. In operation, the second control signal can control the sensing of the battery electrical system signal.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

Figure 1:
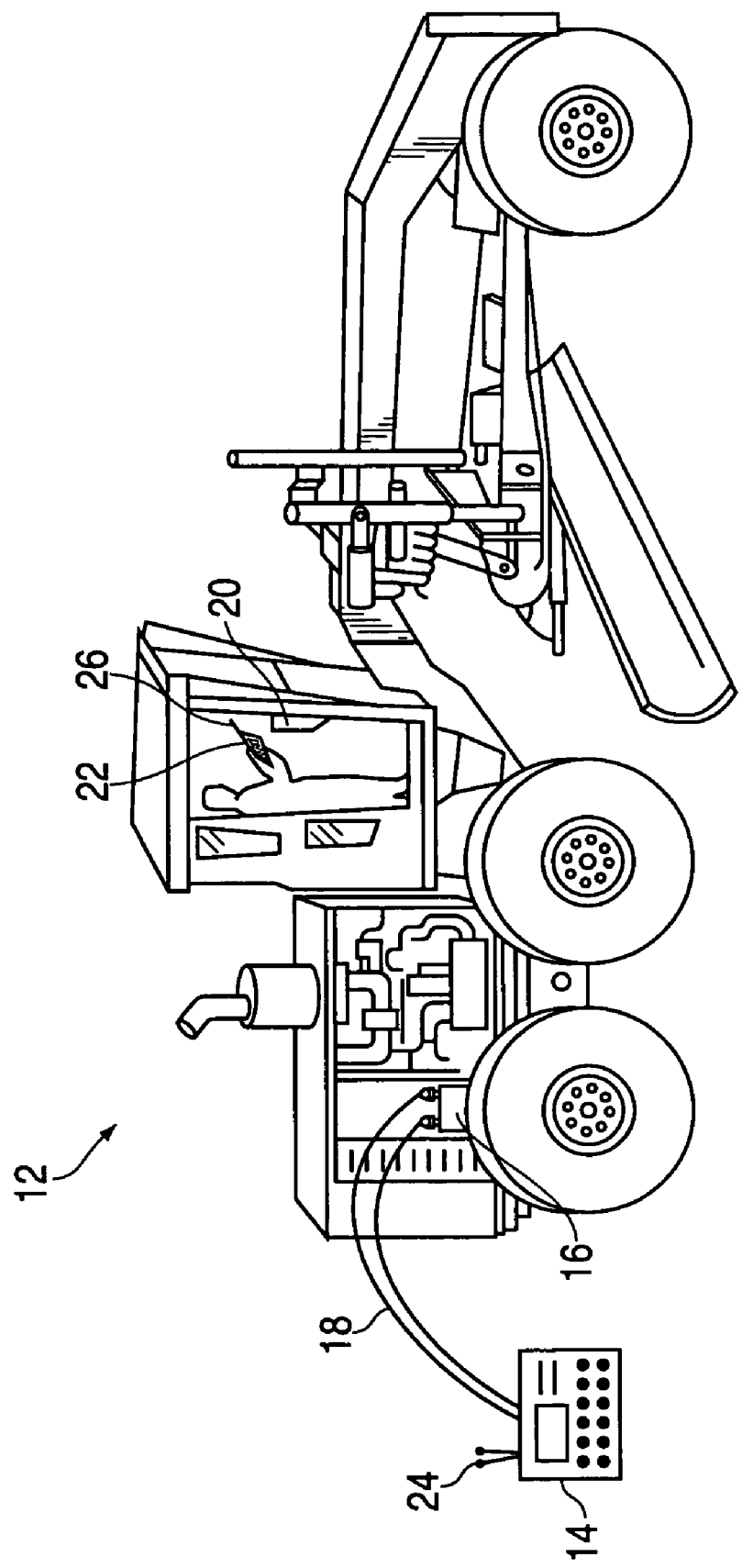
FIG. 1 is a diagrammatic representation of a piece of heavy equipment with a vehicle battery electrical system tester attached, including a remote control device in accordance with one embodiment of the invention.

The invention will now be described with reference to the drawing figures, in which like reference numerals refer to like parts throughout. Although this disclosure refers to "vehicles," those skilled in the art will readily recognize that the disclosure applies equally to a variety of stationary installations, including diesel generators, other power generators, and marine applications. An embodiment in accordance with the present invention provides a vehicle battery and electrical tester ("battery tester") configured to transmit and receive information over a wireless network, and a remote control device configured to communicate with the battery tester over the wireless communications network.

The vehicle battery electrical system tester with remote control allows a user or test operator to monitor and control the tester from a remote location, such as an operator station or control panel of a large or heavy equipment vehicle. This apparatus and method has the advantage that the test operator does not have to use long test leads or move back and forth between the location of the tester and the vehicle control panel in order to perform a series of test operations while monitoring the tester.

An embodiment of the present inventive apparatus and method is illustrated in FIG. 1, which shows a heavy equipment vehicle 12, and the battery tester 14 connected to the heavy equipment vehicle battery 16. The battery 16 is located at a substantial distance from the operator station 20. The battery tester 14 is connected to the battery 16 by test leads, or cables 18. FIG. 1 also shows a remote control unit or device 22 for use with the battery tester 14. The battery tester 14 includes an antenna 24 and the remote control device 22 includes an antenna 26 in order to permit wireless communication between the battery tester 14 and the remote control device 22 over a wireless network.

Figure 2:
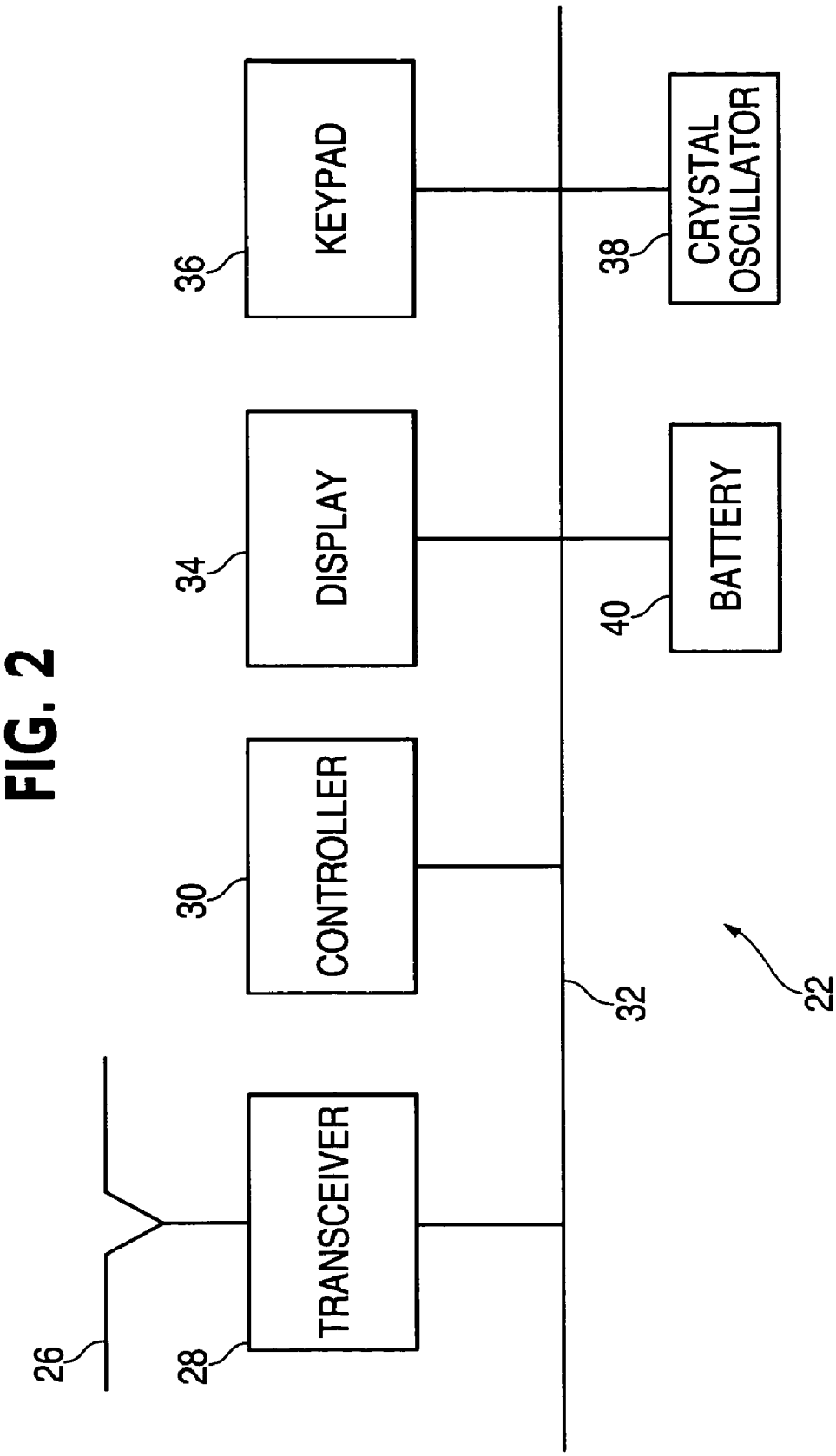
FIG. 2 is a diagrammatic representation of a remote control device of a type suitable for carrying out the functions of an embodiment of the invention.

FIG. 2 shows a diagrammatic representation of a remote control device 22 in accordance with the present inventive apparatus and method. The remote control device 22 can include a radio frequency (RF) transceiver 28. The transceiver 28 can include an analog transmitter and an analog receiver to transmit and receive radio frequency electromagnetic waves by way of an antenna. The transceiver 28 can also include a digital transceiver coupled to the analog transmitter and to the analog receiver, and configured to convert analog electrical signals based on the radio frequency electromagnetic waves into digital electronic signals. Although the transceiver 28 preferably generates an RF signal with a frequency of approximately 2.4 GHz or higher, because a transceiver operating in this range requires a relatively small antenna, for example, an antenna with a length of approximately 2.11 inches or less, which can be enclosed in a hand-held device. Nevertheless, various embodiments can include any suitable RF transceiver that operates at any permissible frequency (in accordance with applicable governmental regulations).

In addition, the remote control device 22 can include a controller 30 (or microcontroller) coupled to the transceiver 28 by way of a communications bus 32. The controller 30 is configured to control the transceiver 28, check the status of the transceiver 28, and read or write data to or from the transceiver. The controller 30 can include a processor or microprocessor that is suitable for controlling the transceiver 28, including a common personal computer (PC), a server, a network of personal computers or servers, a mainframe computer, an embedded microprocessor, or the like. In a preferred embodiment the transceiver 28 includes a radio frequency integrated circuit (RF IC) and an embedded microprocessor controller 30 that are small enough to allow the remote control device 22 to be hand-held. Furthermore, in an alternative embodiment, the transceiver 28 and the controller 30 can be combined in a single integral unit, such as a microchip. The communications bus 32 preferably includes a serial peripheral interface (SPI). However, alternative embodiments of the remote control device 22 include any suitable communications bus capable of transmitting digital communications signals between the transceiver 28 and the controller 30.

Furthermore, the remote control device 22 can include a visual display device 34 that is capable of displaying information in a format that is comprehensible to the test operator. The visual display device 34 can be linked to the controller 30 by way of the communications bus 32. The visual display device 34, in a preferred embodiment, can include a liquid crystal diode (LCD) display unit, such as a 4×16 character LCD display screen. However, in other embodiments the visual display 34 can include any suitable display device, including a cathode ray tube (CRT) monitor, a flat screen monitor, a plasma display screen, or the like.

In addition, the remote control device 22 can include an input device such as the exemplary keypad 36 shown in FIG. 2. The input device can be linked to the controller 32 via the communications bus 32. The exemplary keypad 36 can include an alphanumeric keypad, including transducers, such as keys or buttons, that convert operator input into an electrical signal. In an alternative embodiment, the visual display device and the input device can be integrated into a single device, such as a touch screen. For example, a preferred embodiment of the remote control device 22 includes an input device with four buttons: an up arrow, a down arrow, a "Go" key and a "Menu" key. In this embodiment, the test operator can navigate through a menu system using the four input keys in order to monitor and control the battery tester 14.

In some embodiments, the remote control device 22 can also include a crystal oscillator 38 that generates and provides a reference frequency signal to the transceiver 28 over the communications bus 32. The crystal oscillator 38 vibrates at a harmonic frequency that can depend on external factors, such as temperature, but should meet the specification requirements of the transceiver 28.

In a preferred embodiment, the remote control device 22 can include a battery 40 to provide electrical power to operate the remote control device 22 without requiring that the remote control device 22 be connected to an external power source. The inclusion of the battery 40 in the remote control device 22 has the advantage that the remote control device 22 can be hand-held and easily portable, permitting the test operator to freely move about the vehicle, particularly between the location of the vehicle battery 16 and the vehicle operator station or control panel 20 (see FIG. 1). Alternatively, the remote control device 22 can be plugged into the vehicle's ECU or lighter for external power.

Moreover, the remote control device 22 can include an RF antenna, such as the exemplary antenna 26 shown in FIG. 2. The antenna 26 can include an external antenna attached to the remote control device 22. However, the antenna 26 preferably includes one or more printed wire antennas on a printed circuit board (PCB), or one or more integrated circuit antennas incorporated on a microchip, because these antennas can be installed internally in the remote control device 22 so that an external antenna is not required. An internal antenna has the advantage that the antenna is included within the remote control device 22 and does not extend outside of the remote control device enclosure, and thus is not susceptible to being damaged during handling of the remote control device 22.

Figure 3:
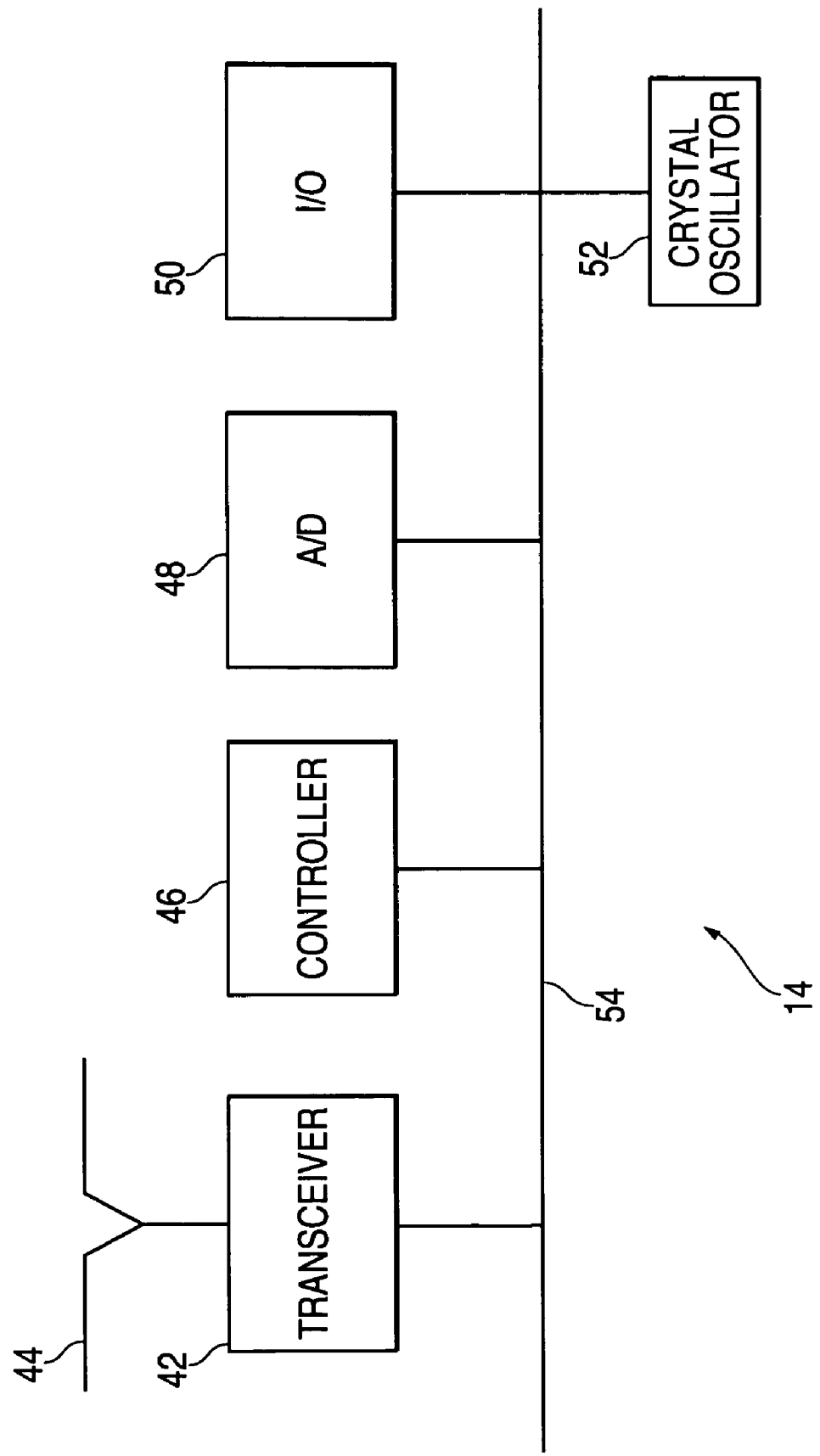
FIG. 3 is a diagrammatic representation of a vehicle battery electrical system tester configured to communicate with the remote control device of FIG. 2.

FIG. 3 is a diagrammatic representation of a battery tester 14 that is suitable for use with the present invention. The battery tester 14 includes a transceiver 42 that is capable of transmitting and receiving radio frequency electromagnetic waves by way of an antenna 44. As in the case of the remote control device transceiver 28, the battery tester transceiver 42 can include an analog RF receiver and an analog RF transmitter. The transceiver 42 also can include a digital transceiver coupled to the analog RF transmitter and to the analog RF receiver that is capable of converting analog electrical signals based on radio frequency electromagnetic waves into digital electronic signals. The transceiver 42 allows the battery tester 14 to communicate with other devices, including a remote control device 22, over a wireless network.

An example of a transceiver that is suitable for use with the remote control device 22 or the battery tester 14 is the Freescale Semiconductor radio frequency integrated circuit transceiver Model MC 13191, which is a short-range, low-power, 2.4 GHz transceiver. The MC13191 is compliant with the IEEE® 802.15.4 standard PHY (Physical) layer, and is compatible with proprietary point-to-point networks based on the 802.15.4 packet structure and modulation format. In a preferred embodiment, the MC13191 can be used with Freescale Semiconductor 802.15.4 Media Access Controller (MAC) software. A second example of a microcontroller that is suitable for use with the battery tester 14 or the remote control device 22 is the µPG2012TK-E2, manufactured by NEC Corporation of Tokyo, Japan.

The battery tester 14 also can include a controller 46 (or microcontroller) coupled to the transceiver 42 by way of a communications bus 54, and configured to control the transceiver 42, check the status of the transceiver 42 and read or write data to or from the transceiver 42. In a preferred embodiment, the transceiver 42 includes a radio frequency integrated circuit (RF IC) incorporated on a microchip, and the controller or processor 46 includes an embedded microcontroller that is integrated on a microchip. This preferred embodiment has the advantage that the transceiver 42 and the controller 46 can be installed in a portable or hand-held vehicle battery electrical system tester 14. Furthermore, in an alternative embodiment, the transceiver 42 and the controller 46 can be combined in a single integral unit, such as a microchip. The communications bus 54 preferably includes a serial peripheral interface (SPI). However, alternate embodiments of the battery tester 14 include any suitable communications bus capable of transmitting digital communications signals between the transceiver 42 and the controller 46.

An example of a microcontroller that is suitable for use with the remote control device 22 or the battery tester 14 is the Freescale Semiconductor Model MC68HC908EY16 manufactured by Freescale Semiconductor Inc. of Austin, Tex., USA. The MC68HC908EY16 is an 8-bit microcontroller unit (MCU) with 512 bytes of on-chip random-access memory (RAM) that is compatible with a serial peripheral interface operating at a maximum bus frequency of 8.0 MHz, and includes 24 general purpose input/output (I/O) pins.

The battery tester 14 also can include an analog-to-digital (A/D) converter 48 configured to convert electrical signals sensed by the battery tester 14 on the cables 18 (see FIG. 1) into digital electronic signals representative of the electrical signals sensed from the vehicle electrical system. The battery tester 14 can further include an input/output (I/O) device 50 configured to receive electrical signals from the vehicle electrical system over the cables 18. (See FIG. 1). The A/D converter 48 and the I/O device 50 can be linked to each other and to the controller 46 via the communication bus 54.

In some embodiments, the battery tester 14 can include a crystal oscillator 52 that produces a reference frequency signal and sends the signal to the transceiver 42, by way of the communications bus 54. The crystal oscillator 52 vibrates at a harmonic frequency that can depend on external factors, such as temperature, but must meet the specification requirements of the transceiver 42. An example of a crystal oscillator that is suitable with the battery tester 14 or the remote control device 22 is the 16 MHz, type DSX321G, manufactured by the Daishinku Corporation of Kakogawa, Japan.

Referring again to FIG. 1, in operation, the battery tester 14 can send instructions or test results to the remote control device 22 by way of a radio frequency wireless network. The remote control device 22 can display the instructions or test results on a visual display device 34 (shown in FIG. 2) so that the operator can view the instructions or results. In turn, the operator can enter input commands into the remote control device 22 by way of the keypad 36 (shown in FIG. 2). The remote control device 22 then can send control signals to the battery tester 14 by way of the wireless network. In this way, a test operator is able to perform test operations at the operator station 20 while simultaneously monitoring and controlling the battery tester 14 through the use of the remote control device 22.

Figure 4:
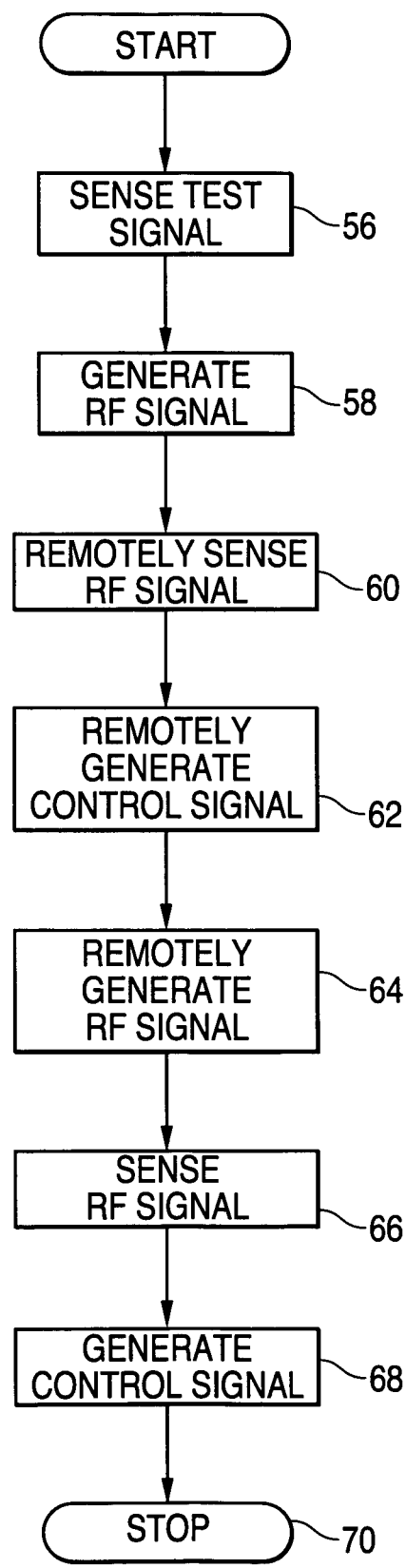
FIG. 4 is a flowchart illustrating steps that may be followed in accordance with one embodiment of the invention.

FIG. 4 is a flowchart illustrating steps that may be followed in accordance with one embodiment of a method of remotely controlling a battery tester. The process begins with sensing of a battery electrical test signal in step 56. As described above, the battery tester can be coupled to the battery electrical system by way of cables. The battery tester can sense an electrical potential or current signal at the cables through an input/output device. The process then continues to step 58.

In step 58, a radio frequency electromagnetic wave can be generated. The RF signal can transmit instructions from the battery tester to a remote control device. Then, in step 60, the remote control device can remotely sense the radio frequency electromagnetic wave. The remote control device can then display the received instructions on a visual display device for operator viewing. The process then continues to step 62.

In step 62, the remote control device can remotely generate a control signal based on operator input received by way of an input device, such as a keypad. Then, in step 64, the remote control device can remotely generate an RF signal to transmit the control signal information to the battery tester. The process then continues in step 66.

In step 66, the battery tester can sense, or receive, the RF signal. Then, in step 68, the battery tester can generate a control signal based on the received RF signal. The generated control signal then can be is used by the battery tester to control the operation of the battery tester during test operations. The process stops in step 70.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A battery electrical system tester with remote control, comprising:
   a battery electrical system tester including a tester radio frequency transceiver; and
   a remote unit including a remote radio frequency transceiver;
   wherein the battery electrical system tester sends data to and receives a control signal from the remote unit by way of the tester radio frequency transceiver, and the remote unit receives the sent data and sends the control signal by way of the remote transceiver, wherein the tester further includes a tester controller linked to and configured to control the tester radio frequency transceiver, and the remote unit further includes a remote controller linked to and configured to control the remote radio frequency transceiver and wherein the tester further includes a tester serial peripheral interface coupled to the tester controller and to the tester radio frequency transceiver to link the tester controller to the tester radio frequency transceiver, and the remote unit further includes a remote serial peripheral interface coupled to the remote controller and to the remote radio frequency transceiver to link the remote controller to the remote radio frequency transceiver.

2. The battery electrical system tester of claim 1, wherein each of the tester radio frequency transceiver and the remote radio frequency transceiver includes a radio frequency integrated circuit.

3. The battery electrical system tester of claim 1, wherein at least one of the following tester radio frequency transceiver or remote radio frequency transceiver includes:
   an analog receiver configured to sense a first radio frequency electrical signal and generate a first analog electrical signal based on the first radio frequency electrical signal;
   an analog transmitter configured to generate a second radio frequency electrical signal based on a second analog electrical signal; and
   a digital transceiver coupled to the analog receiver and to the analog transmitter, the digital transceiver being configured to convert the first analog electrical signal to a first digital electronic signal and to convert a second digital electronic signal to the second analog electrical signal.

4. The battery electrical system tester of claim 1, wherein the tester further includes a tester crystal oscillator coupled to the tester radio frequency transceiver and configured to generate a tester reference frequency signal, and the remote unit further includes a remote crystal oscillator coupled to the remote radio frequency transceiver and configured to generate a remote reference frequency signal.

5. The battery electrical system tester of claim 1, wherein the tester radio frequency transceiver and the remote radio frequency transceiver are configured to operate at or above a radio frequency of approximately 2.4 gigahertz.

6. The battery electrical system tester of claim 1, wherein the tester further includes a tester antenna coupled to the tester radio frequency transceiver and configured to transmit and receive radio frequency electromagnetic waves, and the remote unit further includes a remote antenna coupled to the remote radio frequency transceiver and configured to transmit and receive radio frequency electromagnetic waves.

7. The battery electrical system tester of claim 6, wherein the remote antenna comprises a printed wire antenna.

8. The battery electrical system tester of claim 6, wherein the remote antenna comprises an integrated circuit chip antenna.

9. The battery electrical system tester of claim 1, wherein the remote unit further includes a visual display device configured to display the data sent by the tester and received by the remote unit.

10. The battery electrical system tester of claim 9, wherein the visual display device comprises a liquid crystal display.

11. The battery electrical system tester of claim 1, wherein the remote unit further includes an input device configured to transduce user input.

12. The battery electrical system tester of claim 11, wherein the input device comprises a digital keypad.

13. The battery electrical system tester of claim 1, wherein the remote unit further includes a battery to provide power to operate the remote unit.

14. A battery electrical system tester with remote control, comprising:
   means for testing a battery electrical system;
   first means for generating radio frequency electromagnetic waves coupled to the means for testing;
   first means for sensing radio frequency electromagnetic waves coupled to the means for testing;
   remote means for controlling the means for testing via a control signal;
   second means for generating radio frequency electromagnetic waves coupled to the remote means for controlling; and
   second means for sensing radio frequency electromagnetic waves coupled to the remote means for controlling;
   wherein the means for testing sends data to the remote means for controlling by way of the first means for generating, and the remote means for controlling receives the sent data by way of the second means for sensing, wherein the tester further includes a tester controller means linked to and configured to control the first means for generating and for sensing radio frequency electromagnetic waves, and the remote unit further includes a remote controller means linked to and configured to control the second means for generating and sensing radio frequency electromagnetic waves and wherein the tester further includes a tester serial peripheral interface coupling and linking the tester controller means to the first means for generating and for sensing radio frequency electromagnetic waves, and the remote unit further includes a remote serial peripheral interface coupling and linking the remote controller means to the second means for generating and sensing radio frequency electromagnetic waves.

15. The battery electrical system tester of claim 14, wherein the remote means for controlling includes means for displaying the data sent by the means for sensing and received by the remote means for controlling.

16. The battery electrical system tester of claim 14, wherein the remote means for controlling includes means for transducing operator input.

17. A method of remotely controlling a battery electrical system tester, comprising:
- testing a battery electrical system with a battery electrical system tester;
- generating a first sequence of radio frequency electromagnetic waves to broadcast data based on a test conducted by the tester to a remote unit;
- remotely sensing the first sequence of radio frequency electromagnetic waves with the remote unit;
- remotely generating a first control signal by the remote unit;
- remotely generating a second sequence of radio frequency electromagnetic waves by the tester based on the first control signal;
- sensing the second sequence of radio frequency electromagnetic waves generated by the tester; and
- generating a second control signal by the remote unit based on the second sequence of radio frequency electromagnetic waves;
- wherein the second control signal controls the testing of the battery electrical system.

* * * * *